United States Patent [19]
Sakai et al.

[11] Patent Number: 5,153,035
[45] Date of Patent: Oct. 6, 1992

[54] PROCESS FOR FORMING SILICA FILMS

[75] Inventors: Yasuto Sakai, Takarazuka; Shigeo Hayashi, Nishinomiya; Akihiro Hishinuma, Sagamihara; Akihide Sano, Takarazuka; Shigehito Deki, Kobe, all of Japan

[73] Assignee: Nippon Sheet Glass Co., Ltd., Osaka, Japan

[21] Appl. No.: 764,296

[22] Filed: Sep. 23, 1991

[30] Foreign Application Priority Data

Sep. 29, 1990 [JP] Japan .................... 2-260687

[51] Int. Cl.⁵ ............................................. B05D 1/18
[52] U.S. Cl. .......................................... 427/430.1
[58] Field of Search .................................. 427/430.1

[56] References Cited

U.S. PATENT DOCUMENTS 2,505,629 4/1950 Thomsen et al. .................. 117/124
4,468,420 8/1984 Kawahara et al. ............... 427/397.7

FOREIGN PATENT DOCUMENTS 57-196744 12/1982 Japan .
60-33233 2/1985 Japan .
61-281047 12/1986 Japan .
62-20876 1/1987 Japan .
63-102738 7/1988 Japan .
64-17871 1/1989 Japan .
64-28377 1/1989 Japan .
2-289414 11/1990 Japan .

Primary Examiner—Bernard Pianalto
Attorney, Agent, or Firm—Varndell Legal Group

[57] ABSTRACT

A process for forming a silica film on a substrate which comprises bringing the substrate into contact with an aqueous solution of hydrosilicofluoric acid supersaturated with silica, wherein the supersaturated solution is filled in an inner vessel which is opened downwardly so as to allow the introduction of the substrate thereinto and is arranged inside an outer vessel at a distance from the side walls and the bottom of the outer vessel, and a liquid material having substantially no reactivity and miscibility with the supersaturated solution and having a higher specific gravity than the supersaturated solution is charged in the outer vessel so as to retain the supersaturated solution in the inner vessel without flowing down toward the bottom of the outer vessel, and whereby the supersaturated solution is prevented from being exposed to the atmosphere and accordingly the process can be practiced at high deposition rate in high efficiency and yield without evaporating effective Si components which result in formation of silica particles outside the vessels.

6 Claims, 2 Drawing Sheets

PROCESS FOR FORMING SILICA FILMS

BACKGROUND OF THE INVENTION

The present invention relates to a process for forming films of silica (silicon dioxide) on substrates, and more particularly an improvement of a process for forming silica films wherein silica films are deposited on substrates by bringing the substrates into contact with an aqueous solution of hydrosilicofluoric acid (hexafluorosilicic acid) supersaturated with silica.

There is known a liquid phase deposition (LPD) process wherein silica films are deposited on the surface of a substrate by immersing the substrate into an aqueous solution of hydrosilicofluoric acid supersaturated with silica, as disclosed in U.S. Pat. No. 2,505,629 and Japanese Patent Publications Kokai No. 57-196744, No. 61-281047, (U.S. Pat. application Ser. No. 07/580,356) and No. 62-20876. The supersaturation state of the treating solution is achieved, for instance, by adding a reagent capable of accelerating the decomposition of $H_2SiF_6$, e.g. boric acid, to an aqueous solution of $H_2SiF_6$ substantially saturated with silica, or by elevating the temperature of an aqueous solution of $H_2SiF_6$ substantially saturated with silica.

In the LPD process, it is effective for increasing the rate of deposition of silica to increase the feed rate of the reagent or a heat energy to accelerate the decomposition of $H_2SiF_6$. However, it is known that if the feed rate is too fast, silica particles are produced in the treating solution and the deposition rate is rather decreased. This means that the deposition efficiency, namely efficiency of film formation, as represented by a ratio of the amount of silica deposited to the amount of reagent or heat energy fed, is decreased.

In order to increase the deposition rate with controlling the production and growth of silica particles, namely in order to increase the deposition efficiency, there is proposed a process wherein the reagent or heat energy is continuously fed, and silica particles produced in the treating solution are filtered out while circulating a part of the treating solution, as disclosed in Japanese Patent Publications Kokai No. 60-33233 and No. 63-102738.

Also, in order to form a dense silica film in the LPD process, it is proposed to conduct the silica deposition at a high temperature of the treating solution (e.g. Japanese Patent Publication Kokai No. 1-28377), or it is proposed to use an aqueous $H_2SiF_6$ solution having a high concentration as the treating solution (e.g. Japanese Patent Publication Kokai No. 1-17871).

However, in these proposed processes, Si components presumed to be $H_2SiF_6$ or $SiF_4$ evaporate vigorously from the treating solution, so silica particles are formed at the interface between the treating solution and the atmosphere and on the wall of a treating solution tank at positions over the surface of the treating solution. The formation of silica particles is a loss of a component capable of forming a silica film in the treating solution. The evaporation of effective component results in decrease of deposition efficiency and moreover pollutes the working environment.

In order to prevent the evaporation of Si components from the treating solution, it is proposed to eliminate the interface of the treating solution and the surrounding gas by floating a liquid material having no or low reactivity with the treating solution and a lower specific gravity than the treating solution (e.g. Japanese Patent Publication Kokai No. 2-289414). However, the representative liquid materials used to form a barrier layer on the treating solution are aliphatic hydrocarbons of the formula: $C_nH_{2n+2}$ wherein n is an integer of 4 to 31, and the industrial use thereof is dangerous because in general they have an inflammability and a high vapor pressure or are harmful. Further, when the temperature of treating solution is raised in order to form a dense silica film, the floating liquid material, in its turn Si components, are evaporated from the treating solution.

It is an object of the present invention to provide a process for forming silica films on substrates in a high efficiency.

A further object of the present invention is to provide a process for forming silica films at a high silica deposition rate without loss of Si components effective for the film formation resulting from formation of silica particles in the treating solution and evaporation of Si components from the treating solution.

These and other objects of the present invention will become apparent from the description hereinafter.

SUMMARY OF THE INVENTION

In accordance with the present invention, there is provided a process for forming a silica film on a substrate which comprises bringing the substrate into contact with an aqueous solution of hydrosilicofluoric acid supersaturated with silica in a treatment vessel, said vessel being opened downwardly and said aqueous solution being filled in said vessel and supported by a liquid material having substantially no reactivity and miscibility with said aqueous solution and having a higher specific gravity than said aqueous solution, thereby preventing said aqueous solution from being exposed to the atmosphere.

Since the process of the present invention can prevent Si components from evaporating from the treating solution, there can be prevented formation of silica particles outside the treatment apparatus, pollution of working environment and decrease in yield of product owing to formation of silica particles. Also, it is possible to increase the deposition efficiency as defined above and the deposition rate, and the process of the invention is particularly effective when it is desired to form a dense silica film by raising the $H_2SiF_6$ concentration or temperature of the treating solution.

DETAILED DESCRIPTION

Figure 1:
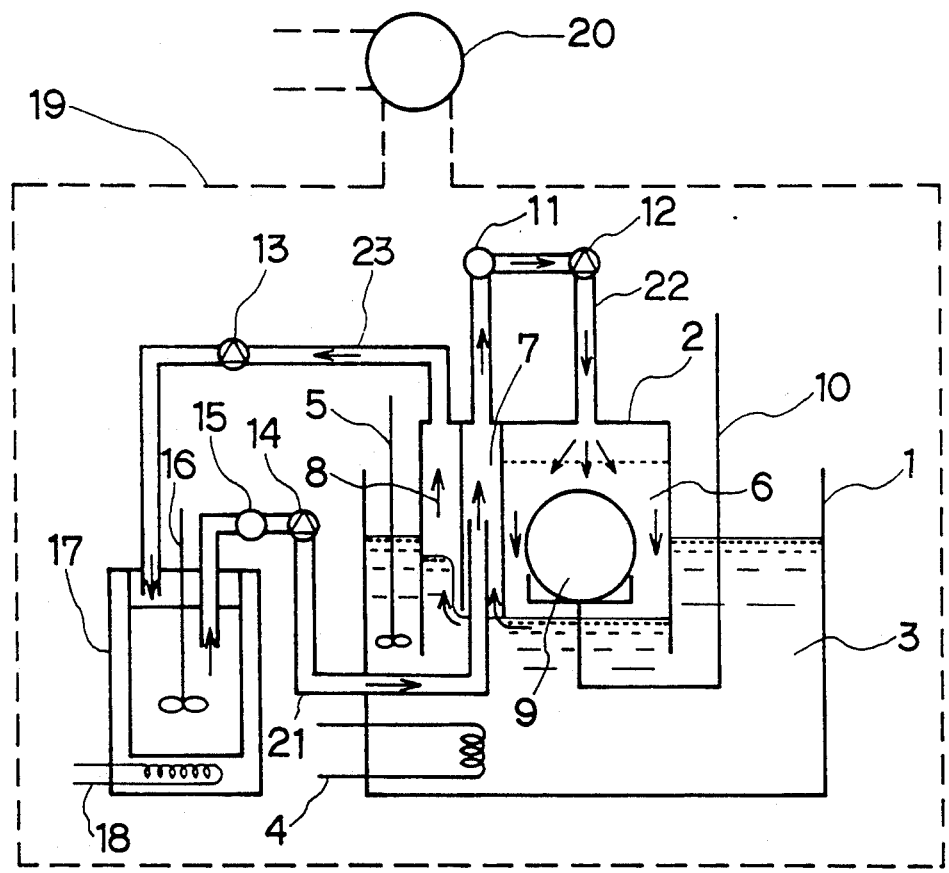
FIG. 1 is an illustrative view showing an embodiment of an apparatus used for practicing the process of the present invention.

In the process of the present invention, an aqueous solution of hydrosilicofluoric acid supersaturated with silica is used as the treating solution, and a silica film is formed on a substrate by bringing the substrate into contact with the treating solution, typically by immersing the substrate in the treating solution, until the silica film having a desired thickness is deposited on the surface of the substrate, according to the known LPD process. The preparation of the hydrosilicofluoric acid solution supersaturated with silica is not restricted to a particular manner, and known manners are applicable. For example, the supersaturated solution is prepared by adding a reagent capable of accelerating the decomposition of hydrosilicofluoric acid, e.g. boric acid or aluminum, to an aqueous solution of hydrosilicofluoric acid substantially saturated with silica, or by preparing the substantially saturated solution at a low temperature, preferably at a temperature below 35° C., and elevating the temperature of the substantially saturated solution, preferably to a temperature not exceeding 70° C. The concentration of $H_2SiF_6$ is usually from 1.0 to 4 moles/liter.

In the present invention, in order to prevent evaporation of Si components from the treating solution, the LPD process is practiced without exposing the treating solution to the surrounding atmosphere by adopting a means such that the treating solution is put in a vessel having an opening on its bottom side and is supported by a liquid material having substantially no reactivity and miscibility with the treating solution and having a higher specific gravity than the treating solution.

From the industrial point of view, it is important that the process can be safely carried out. Accordingly, it is preferable that the liquid material used for shutting off the contact of the exposed surface of the treating solution in the vessel with the surrounding atmosphere is those having a low vapor pressure at an operating temperature, and moreover having no or low reactivity with the treating solution, a low solubility in water, a lower melting point than the temperature at which the treating solution is prepared, a higher specific gravity than the treating solution, especially a specific gravity of at least 1.3, and a boiling point of at least 80° C. Examples of the liquid material are, for instance, a liquid fluorine-containing inert material, e.g. a fluorine-containing liquid material commercially available under the trade mark "Fluorinert" from Minnesota Mining & Manufacturing Co., ethylene dibromide, tribromofluoromethane, tetrabromoacetylene, tetrabromoethane, bromoform, 1,1,2-tribromoethane, 1,2-dibromo-1,2-dichlorethane, 1,2-dibromochloroethane, bromotrichloroethane, trichloroethylene, tetrachloroethane, pentachloroethane, and other liquid halogenated hydrocarbons.

The process of the present invention is applicable to various substrates. Representative examples of the substrates are, for instance, glasses such as alkali metal-containing glass, silica glass and non-alkali glass; ceramics; semiconductors such as silicon semiconductor and gallium arsenide semiconductor; and other various materials which do not cause undesirable reaction with the treating solution.

The formation of silica film on substrates may be carried out batchwise or continuously. In a continuous operation, a part of the treating solution is continuously taken out of the treatment vessel and circulated while saturating the withdrawn treating solution again by dissolving silica therein.

The process of the present invention will be explained particularly with reference to FIG. 1 which shows an embodiment of an apparatus used for carrying out the process of the present invention. The apparatus has outer tank 1 and inner tank 2. A liquid material 3 having a higher specific gravity than the treating solution is charged in the outer tank 1. The temperature of liquid material 3 is adjusted by temperature controller 3, whereby the treating solution filled in the inner tank 2 is adjusted to a desired deposition temperature. The liquid material 3 may be agitated by agitator 5 in order to make the temperature of liquid material 3 uniform. The inner tank 2 is opened downwardly and is arranged inside the outer tank 1 in such a positional relationship that the inner tank 2 is positioned inside the outer tank at a distance from the side walls and bottom of the outer tank and is partly immersed in the liquid material 3 charged in the outer tank 1, whereby the treating solution is retained in the inner tank 2 without being exposed to the surrounding atmosphere and without flowing downwardly toward the bottom of the outer tank 1.

The inner tank 2 is composed of treating chamber 6, feed chamber 7 and discharge chamber 8. An aqueous solution of $H_2SiF_6$ substantially saturated with silica is prepared in preparation tank 17 equipped with stirrer 16 and temperature controller 18 by dissolving silica in an aqueous solution of $H_2SiF_6$. In case of supersaturating the solution by elevating the temperature of the saturated solution, preferably the saturated solution is prepared at a temperature of not more than 35° C., especially not more than 15° C., more especially not more than 0° C. The saturated solution is fed through feed pipe 21 to feed chamber 7 by pump 14 and then through feed pipe 22 to treating chamber 6 from the upper portion thereof by pump 12. The feed pipes 21, 22 may be provided with filters 11 and 15 for removing silica particles produced during the operation and other contaminants. In case of supersaturating the saturated solution by means of an additive such as boric acid, aluminum, water or sodium silicate, the additive is usually added to the saturated solution prior to feeding the saturated solution to feed chamber 7. A substrate 9 to be treated is supported by substrate holder 10 and is introduced into the supersaturated solution in the treating chamber 6 from the bottom opening portion. The supersaturated solution is usually maintained at a temperature between room temperature and about 70° C. A part of the supersaturated solution in treating chamber 6 is continuously taken out through discharge chamber 8 and is returned to preparation tank 17 through return pipe 23 by pump 13.

According to the present invention, Si components can be prevented from evaporating from the treating solution because the contact of the treating solution with the atmosphere is shut off. Consequently, undesirable silica particles can be prevented from being produced outside the apparatus, and the process can be practiced without decreasing the yield. In addition to prevention of evaporation of silicon compounds, since liquid materials used for covering the surface of the treating solution are those having a high specific gravity and a low vapor pressure and since the contact area of the covering materials with the atmosphere is small, the process can be practiced with decreased pollution of working environment. Further, it is possible to make the formation of silica films at an increased deposition rate in an increased deposition efficiency, and in particular the process of the present invention is effective for the film formation at a high hydrosilicofluoric acid concentration or at a high deposition temperature.

The present invention is more specifically described and explained by means of the following Examples. It is to be understood that the present invention is not limited to the Examples.

EXAMPLE 1

An apparatus for forming a silica film on substrates shown in FIG. 1 was operated, and silicon-containing components generated from the apparatus was measured.

A fluorine-containing liquid material commercially available under the trade mark "Flourinert" FC-40 from Minnesota Mining Mfg. Co. (specific gravity 1.87, boiling point 155° C. melting point −57° C., solubility in water 0.0007 g per 100 g of water) was filled between outer tank 1 and inner tank 2, and kept at 35° C. by temperature controller 4. The Fluorinert liquid was agitated with stirrer 5 in order to make the temperature uniform. Two liters of a treating solution prepared in preparation tank 17 kept at −3° C. with cooling means 16 by dissolving silica gel powder in a 2 moles/liter aqueous solution of hydrosilicofluoric acid up to saturation was charged in the inner tank 2 composed of treating chamber 6, feed chamber 7 and discharge chamber 8.

In order to start circulation of the treating solution, circulation pump 12 was operated so as to send forth the treating solution in the feed chamber 7 at a rate of 160 ml/minute to the treating chamber 6 through filter 11 having an absolute exclusion limit of 1.5 μm. Thereafter, the treating solution prepared in tank 17 was fed to the feed chamber 7 at a rate of 6 ml/minute through filter 15 by pump 14. Simultaneously, the treating solution was discharged at the same rate from the discharge chamber by pump 13 and returned to the tank 17 wherein the returned solution was cooled to −3° C. and saturated again with silica by dissolution of silica gel powder.

The apparatus was installed in a draft chamber 19 and the above procedures were effected therein. The gas discharged from the draft chamber 19 by draft fan 20 was trapped in pure water, and the trapping water was analyzed by plasma emission spectrophotometry to determine the presence of silicon-containing components generated from the apparatus.

Even after the operation for 24 hours, no presence of Si components was observed in the trapping water. Also, no formation of white silica particles was observed in the neighborhood the apparatus. From these results, it is understood that the contact of the treating solution with the atmosphere is completely shut off and, therefore, the evaporation of Si components from the treating solution can be prevented.

EXAMPLE 2

The apparatus shown in FIG. 1 was operated under the same conditions as in Example 1, and a silica film was formed on a substrate.

A silicon wafer was used as the substrate 9, and the wafer supported on substrate holder 10 was immersed in the treating solution in the treating chamber 6.

After starting the heating and circulation of the treating solution, a wafer was exchanged with a fresh wafer in order to investigate the change of deposition rate with the lapse of time.

Figure 2:
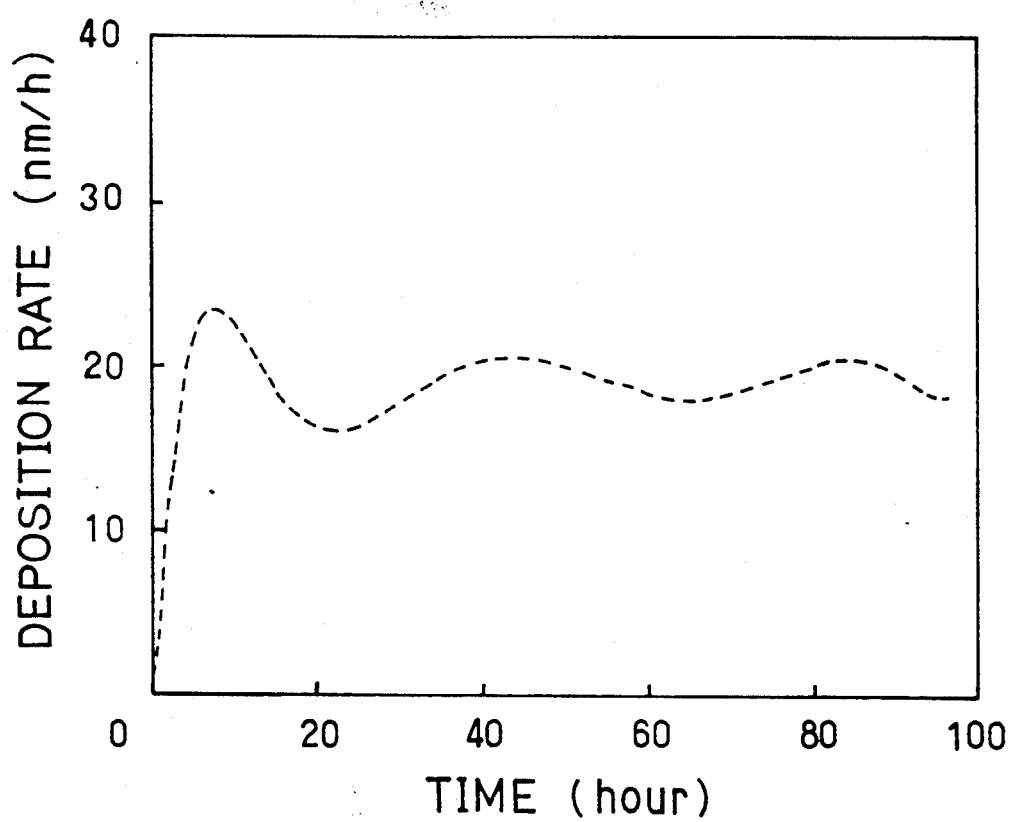
FIG. 2 is a graph showing a change of deposition rate with the lapse of time.

The results are shown in FIG. 2. It is observed that the silica film is formed at a deposition rate of about 20 nm/hour on average. From these results, it is found that silica films can be continuously formed on substrates by the process of the present invention.

What we claim is:

1. A process for forming a silica film on a substrate which comprises bringing the substrate into contact with an aqueous solution of hydrosilicofluoric acid supersaturated with silica in a treatment vessel, said vessel being opened downwardly and said aqueous solution being filled in said vessel and supported by a liquid material having substantially no reactivity and miscibility with said aqueous solution and having a higher specific gravity than said aqueous solution, thereby preventing said aqueous solution from being exposed to the atmosphere.

2. The process of claim 1, wherein said liquid material has a specific gravity of at least 1.3 and a boiling point of at least 80° C.

3. The process of claim 2, wherein said liquid material is a halogenated hydrocarbon.

4. The process of claim 1, wherein said aqueous solution supersaturated with silica is filled in said treatment vessel which has only on the bottom side an opening capable of allowing the introduction of the substrate thereinto and which is arranged inside an outer vessel at a distance from the bottom of said outer vessel, and said liquid material is charged in said outer vessel so as to retain said aqueous solution in said treatment vessel.

5. The process of claim 1, wherein a part of said aqueous solution supersaturated with silica in said treatment vessel is continuously taken out, saturated again with silica and returned to said treatment vessel.

6. The process of claim 1, wherein said aqueous solution supersaturated with silica in said treatment vessel is maintained at a temperature between room temperature and 70° C.

* * * * *